(12) United States Patent
Petropoulos et al.

(10) Patent No.: US 6,980,002 B1
(45) Date of Patent: Dec. 27, 2005

(54) INTEGRATED CERVICAL-THORACIC-LUMBAR SPINE MRI ARRAY COIL

(75) Inventors: Labros Spiridon Petropoulos, Burton, OH (US); Mark Xueming Zou, Mantua, OH (US); Tsinghua Zheng, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/700,741

(22) Filed: Nov. 4, 2003

Related U.S. Application Data

(60) Provisional application No. 60/423,505, filed on Nov. 4, 2002.

(51) Int. Cl.[7] ............................ G01V 3/00; A61B 5/055
(52) U.S. Cl. ...................... 324/318; 600/422; 324/309
(58) Field of Search .............................. 324/318–322, 324/309, 511; 600/422, 410, 424

(56) References Cited

U.S. PATENT DOCUMENTS

| | | | |
|---|---|---|---|
| 4,825,162 A | | 4/1989 | Roemer et al. |
| 5,085,219 A | * | 2/1992 | Ortendahl et al. ........... 600/422 |
| 5,166,618 A | * | 11/1992 | Jones et al. ................. 324/318 |
| 5,198,768 A | | 3/1993 | Keren |
| 5,361,765 A | * | 11/1994 | Herlihy et al. .............. 600/422 |
| 5,390,672 A | * | 2/1995 | Jones .......................... 600/422 |
| 5,477,146 A | * | 12/1995 | Jones .......................... 324/318 |
| 5,543,711 A | | 8/1996 | Srinivasan et al. |
| 5,664,568 A | | 9/1997 | Srinivasan et al. |
| 5,910,728 A | | 6/1999 | Sodickson |
| 6,356,081 B1 | * | 3/2002 | Misic .......................... 324/318 |
| 6,366,799 B1 | * | 4/2002 | Acker et al. ................. 600/424 |
| 6,441,612 B1 | * | 8/2002 | Shimo et al. ................ 324/309 |
| 6,577,888 B1 | * | 6/2003 | Chan et al. .................. 324/318 |
| 6,591,128 B1 | * | 7/2003 | Wu et al. ..................... 600/422 |
| 6,624,633 B1 | | 9/2003 | Zou et al. |
| 6,650,926 B1 | * | 11/2003 | Chan et al. .................. 600/422 |
| 6,750,653 B1 | * | 6/2004 | Zou et al. .................... 324/318 |
| 6,784,665 B1 | * | 8/2004 | Chan et al. .................. 324/318 |
| 6,788,057 B1 | * | 9/2004 | Petropoulos et al. ........ 324/318 |
| 2004/0183543 A1 | * | 9/2004 | Lan et al. .................... 324/511 |
| 2005/0099179 A1 | * | 5/2005 | Monski et al. .............. 324/318 |

FOREIGN PATENT DOCUMENTS

WO     WO9954746 A1     10/1999

OTHER PUBLICATIONS

Jaco. A De Zwart, et al., "Design of a SENSE-Optimized High-Sensitivity MRI Receive Coil for Brain Imaging," Magn. Resonance. Med., 47:1218-1227 (2002).

* cited by examiner

*Primary Examiner*—Brij Shrivastav
*Assistant Examiner*—Tiffany A. Fetzner
(74) *Attorney, Agent, or Firm*—Carl B. Horton, Esq.; Armstrong Teasdale LLP

(57) ABSTRACT

A MRI array coil for imaging a human includes a posterior array, an anterior torso array and an anterior head-neck-upper-chest array. The head-neck-upper-chest array has a head portion mountable to the anterior array and a neck-upper-chest portion hingingly attached to the head portion.

20 Claims, 4 Drawing Sheets

INTEGRATED CERVICAL-THORACIC-LUMBAR SPINE MRI ARRAY COIL

CROSS-REFERENCE TO RELATED APPLICATIONS

This application claims priority to and the benefit of the filing date of U.S. Provisional application No. 60/423,505 filed Nov. 4, 2002 titled "integrated Cervical-Thoracic-Lumbar Spine Array Coil" and which is hereby incorporated by reference in its entirety.

BACKGROUND OF THE INVENTION

The present invention relates of magnetic resonance imaging (MRI) coils and, in particular, to array coils therefor.

The phased array configuration for RF coils in magnetic resonance imaging was introduced by Roemer et al. as set forth in U.S. Pat. No. 4,825,162. Based on this design a set of surface coil loops are critically decoupled relative to each other and simultaneously receive the NMR signal which is generated in the imaging region that is excited by a dedicated volume coil. The signal from these surface coils is then reconstructed to generate an image which is multiple times larger that the size of each individual loop in the array. According to this method, because the size of each element in the phased array is relatively small compared with the final reconstructed image, the noise figure is reduced and the signal obtained from each element of the phased array is increased, and the final results is a significant increase in Signal-to-Noise Ratio (SNR) for the final reconstructed image. The first application of this phased array design was intended for the spine region. The logic behind this application was that the required coverage of the spine area on the human body is extremely large and a single receive coil structure can not adequately provide the image quality necessary for clinical evaluation.

Modification have been presented over the years including modifications or improvement of Roemer's invention. Specifically Keren. in U.S. Pat. No. 5,198,768 extended Roemer's invention to include figure-8 shaped loops commonly known as "butterflies".

Following that patent was U.S. Pat. No. 5,543,711 by Srinivasan et al. where instead of surface coils for receive only purposes, he only utilized birdcage resonators which are volume RF coils for a phased array configuration.

In order to enhance the ability to image the cervical-thoracic-lumbar spine area, a new phased array design (U.S. Pat. No. 6,624,633) was developed to cover this area. This design includes, for example, 6 quadrature pairs (6 loop and 6 saddle coils in quadrature configuration).

In U.S. Pat. No. 5,910,728 entitled "Simultaneous acquisition of Spatial Harmonics (SMASH): Ultra Fast Imaging with Radio Frequency Coils", Sodickson describes a parallel processing algorithm that exploits spatial information inherent in a surface coil array to increase magnetic resonance (MR) image acquisition speed, resolution and/or field of view. Partial signals are acquired simultaneously in the component coils of the array and formed into two or more signals corresponding to orthogonal spatial representations. In a Fourier embodiment, lines of the k-space matrix required for image production are formed using a set of separate, preferably linear combinations of the component coil signals to substitute for spatial modulations normally produced by phase encoding gradients. The signal combining may proceed in a parallel or flow-through fashion, or as post-processing, which in either case reduces the need for time-consuming gradient switching and expensive higher field magnet arrangements.

In the post-processing approach, stored signals are combined after the fact to yield the full data matrix. In the flow-through approach, a plug-in unit consisting of a coil array with an on board processor outputs two or more sets of combined spatial signals for each spin conditioning cycle, each directly corresponding to a distinct line in k-space. This partially parallel imaging strategy, SMASH, is readily integrated with many existing fast imaging sequences, yielding multiplicative time savings without a significant sacrifice in spatial resolution or signal-to-noise ratio.

In a similar fashion another parallel processing algorithm was presented where the acceleration of image acquisition was performed on the time domain space instead of the frequency domain space. This parallel acquisition technique referred as SENSE (SENSitivity Encoding) by K. P. Prueessmann et. al. in their PCT Patent Application No. WO9954746A1 entitled "Magnetic Resonance Imaging Method and Apparatus" shows a method for obtaining images by means of magnetic resonance (MR) of an object placed in a static magnetic field, which method includes simultaneous measurement of a number of sets of MR signals by application gradients and an array of receiver coils, reconstruction of a number of receiver coil images from the sets MR signals measured and reconstruction of a final image from a distant dependent sensitivity of the receiver coils and the first plurality of receiver coil images. In order to reduce the acquisition time the number of phase encoding steps corresponding to the phase-encoding gradient is reduced with a reduction factor compared to standard Fourier imaging, while a same field of view is maintained as in standard Fourier imaging. In this way fast cardiac imaging may be possible. According to the application the calculation of complicated matrix inversion can be simplified by determining of an image vector of the final image from a combination of a generalized inverse of a sensitivity matrix and a receiver coil image vector. In this way aliasing artifacts in the final image are reduced. Furthermore, the reconstruction method enables application of non-integer reduction factors.

Over the past few years, different modifications of these techniques have been presented. GRAPPA (Generalized Autocalibrating Partially Parallel Acquisitions) technique (M. K. Griswold et. al. Magnetic Resonance in Medicine), a modified SMASH technique, where according to that technique, no detailed and highly accurate RF field map of the coil array is required prior to image acquisition. According to that technique, for each image acquisition, additional lines on the center of k-space are obtained that are needed to describe the RF field map of the array. Thus this technique can compensate for any motions or changes on the profile of the RF field map during the image acquisition. According to this technique, SNR and image quality are improved since the steps of image reconstruction and image combination are performed in separate steps.

The characteristics of all of these parallel imaging techniques is that the acceleration speed is directly proportional to the number of independent receivers along the direction that the image acceleration needs to be applied. In these terms, the higher the number of receiver coils the faster the acceleration speed for acquiring an image with better SNR and improved image quality. It is characteristic that for coils focused on SENSE applications the SNR of the accelerated image is given by:

$$SNR_{SENSE} = \frac{SNR}{g\sqrt{R}}$$

where $SNR_{SENSE}$ represents the resulted Signal to Noise Ratio (SNR) of the SENSE image after the acceleration speed has been determined, SNR corresponds to the original SNR of the coil without SENSE acquisition and g defines the geometry factor of the coil that is strongly dependent on the geometric placement on the coil's mechanical former and their placement around the targeted field of view (FOV). The g value is a representation of the additional noise factor that the accelerated reconstructed image will be accompanied with. The optimum value of a g factor is 1 (no additional noise added during reconstruction) and a typical value for g value for clinically viable images ranges from 1.1 to 1.8 inside the designated FOV. M. Wieger in his paper entitled "Specific Coil Design for SENSE: A Six Element Cardiac Array" (Magnetic Resonance in Medicine, Vol. 45, 495–504 (2001).) indicates that the g factor for the coil significantly improves (closer to 1) when the coils on the array are not overlapping. He further indicates that the best g factor q achievable is when the coils are separated by a distance of 1 cm. The reason is that SENSE reconstruction software relies strongly on both the magnitude and phase information for each loop of the array coil system. By physically separating the coils in the array by a certain distance, the B1 field mapping (magnitude and phase) for each coil on the array can be uniquely defined in such a way that the reconstructed accelerated image contains little or not additional noise.

After the introduction of SMASH and SENSE techniques, a plethora or new coil designs were presented trying to incorporate the advantages of high speed imaging using parallel acquisition techniques. Wieger et al. used a six element array of loops separated by 1 cm between adjacent elements that was capable of accelerating the image acquisition by a factor of R=3 without degrading clinically the resulting images. This coil focused on imaging the periphery of the human torso and was concentrated only on the cardiac anatomy of the human body. Most of the SENSE, SMASH application papers are targeting brain imaging applications ("Design of a SENSE optimized High Sensitivity MRI Receive coil for Brian Imaging", Jaco. A de Zwart, et. al. Mag. Res. Med. 47:1218–1227 (2002)). There has been no use of the techniques for imaging the cervical through the thoracic and ending on the lumbar spine.

U.S. Pat. No. 6,624,633 shows a cervical, thoracic, lumbar spine coil. The presence of a loop and a saddle coil provides the optimum SNR at the region of the spinal cord and the disc area, but it can not be altered to be suitable for SENSE and SMASH parallel processing applications. The reason is that the saddle and the loop are designed to provide the strongest and more uniform circularly polarized field on the spine area. since the B1 profile for these two coils is nearly indistinguishable around the spine region, the g-factor values for such a coil are severely elevated.

SUMMARY OF THE INVENTION

A MRI array coil for imaging a human includes a posterior array, an anterior torso array and an anterior head-neck-upper-chest array. The head-neck-upper-chest array has a head portion mountable to the anterior array and a neck-upper-chest portion hingingly attached to the head portion.

DESCRIPTION OF THE PREFERRED EMBODIMENTS

Figure 1:
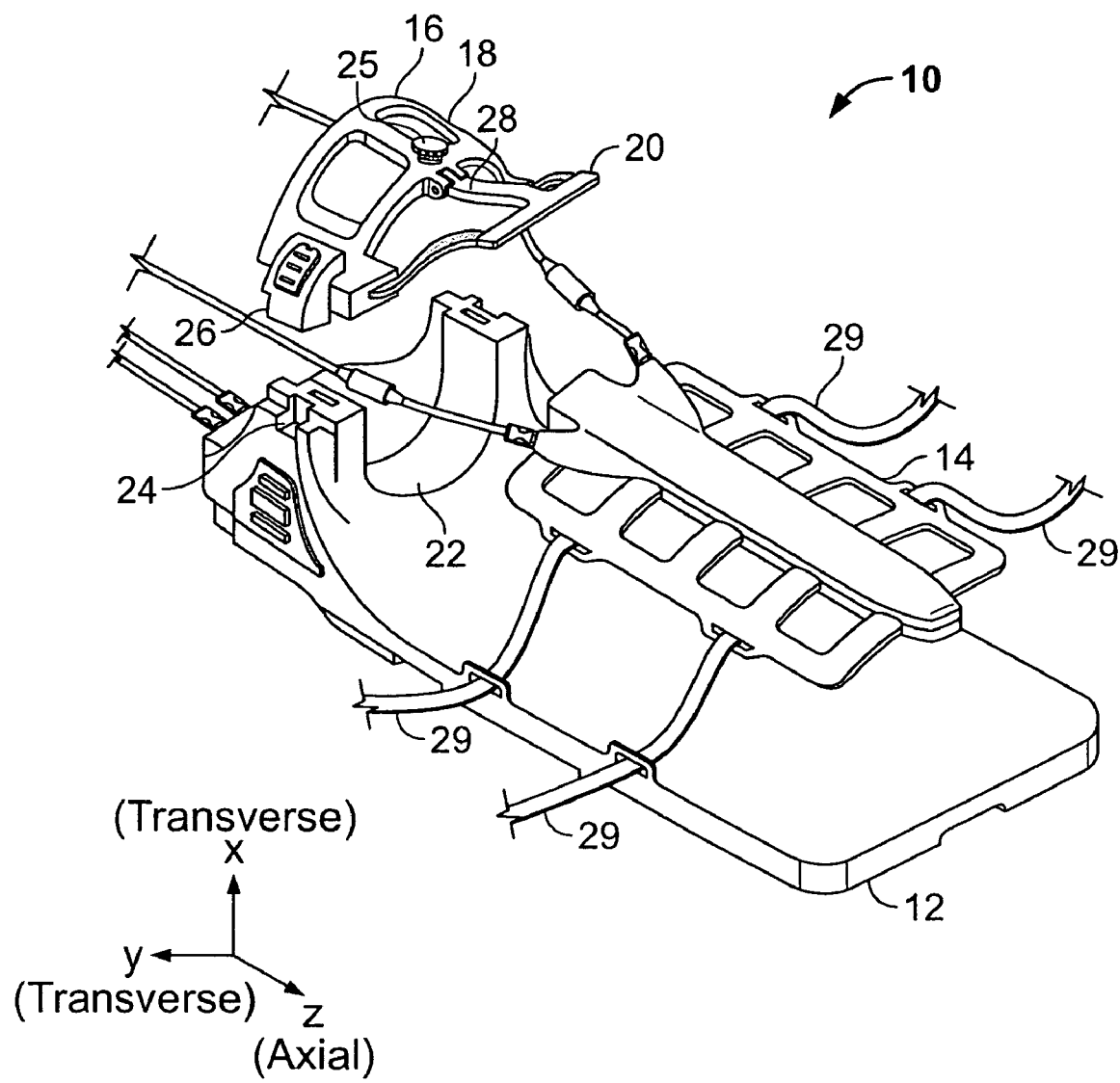
FIG. 1 is a perspective view of an array coil according to the invention.

Referring to FIG. 1, a MRI coil array 10 for imaging the head, neck, upper chest and torso of a human patient includes a posterior array 12, an anterior torso coil 14 and an anterior head-neck-upper-chest array 16.

The head-neck-upper-chest array 16 includes a head portion 18 and a neck-upper-chest portion 20.

The posterior array 12 is in the form of a rigid structure the patient lays on. The patent's head is cradled in the area 22. After a patient lays on the array 12, the head portion 18 is mounted to the array 12 by the interlocking structures 24, 26 or by other suitable method. The neck-upper-chest portion 20 is attached to the head portion 18 by a hinging joint 28. It is also possible to make the portion of the posterior array 12 that is not involved in the mounting of the array 16 flexible. In addition, a rigid frame may be used in the array 12 and the coils themselves made flexibly conformable to the patient.

Figure 2:
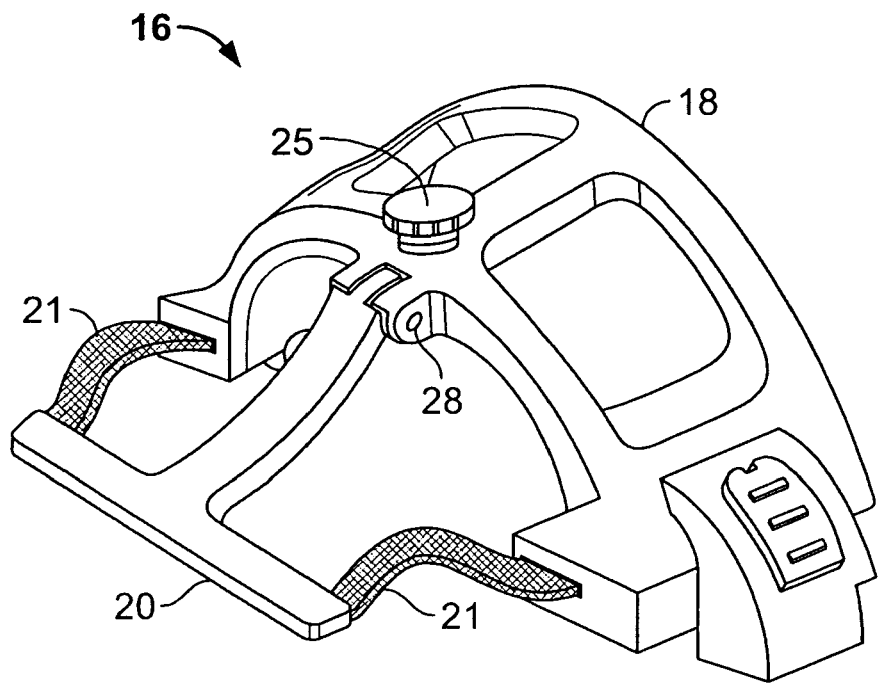
FIG. 2 is a perspective view of the head-neck-upper-chest array of the coil of FIG. 1 with the neck-upper-chest portion rotated downwardly.
Figure 3:
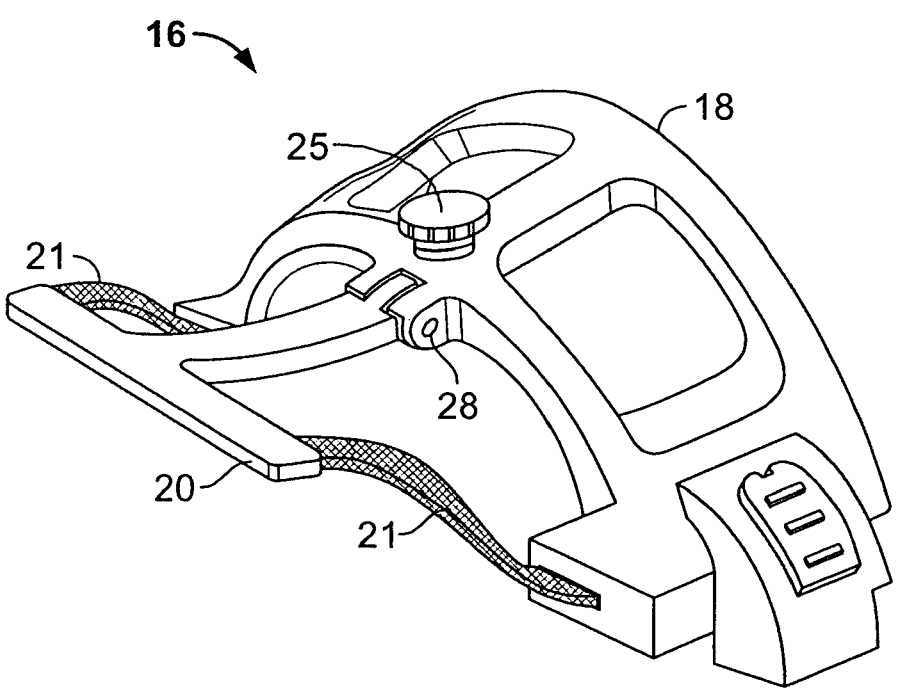
FIG. 3 is a perspective view of the head-neck-upper-chest array of the coil of FIG. 1 with the neck-upper-chest portion rotated upwardly.
Figure 4:
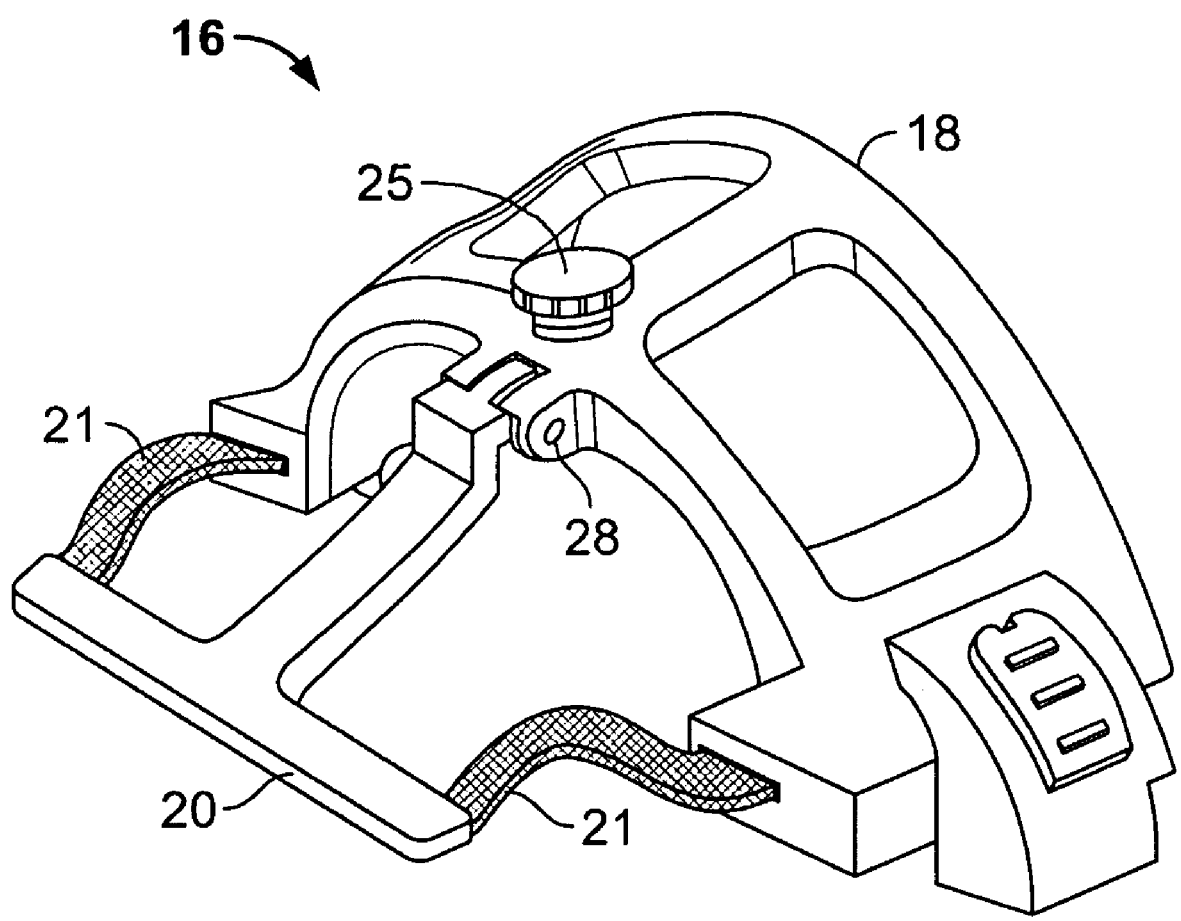
FIG. 4 is a perspective view of the head-neck-upper-chest array of the coil of FIG. 1 with the neck-upper-chest portion translated downwardly.

The neck-upper-chest portion 20 may be pivoted downwardly to a position suitable for a small patient as shown in FIG. 2. The sides 21 of the portion 20 may be advantageously formed of flexible materials to facilitate this movement. FIG. 3 shows the neck-upper-chest portion 20 pivoted upwardly to a position suitable for a large patient. FIG. 4 shows the neck-upper-chest portion 20 translated downwardly for further conformance to a patient. A locking member 25, (shown in FIGS. 1 through 4) which may comprise, but is not limited to a rotatable knob or dial, is also provided in order to lock the hinging joint 28 of the neck-upper-chest portion 20 in different positions and thereby prevent or resist movement of the neck-upper-chest portion 20.

The anterior torso array 14 may also may be of a flexible construction such as foil coil elements in a flexible plastic structure. This allows the array 14 to conform closely to the human torso. The array 14 may also be secured to the array 12 with flexible straps 29.

Figure 5:
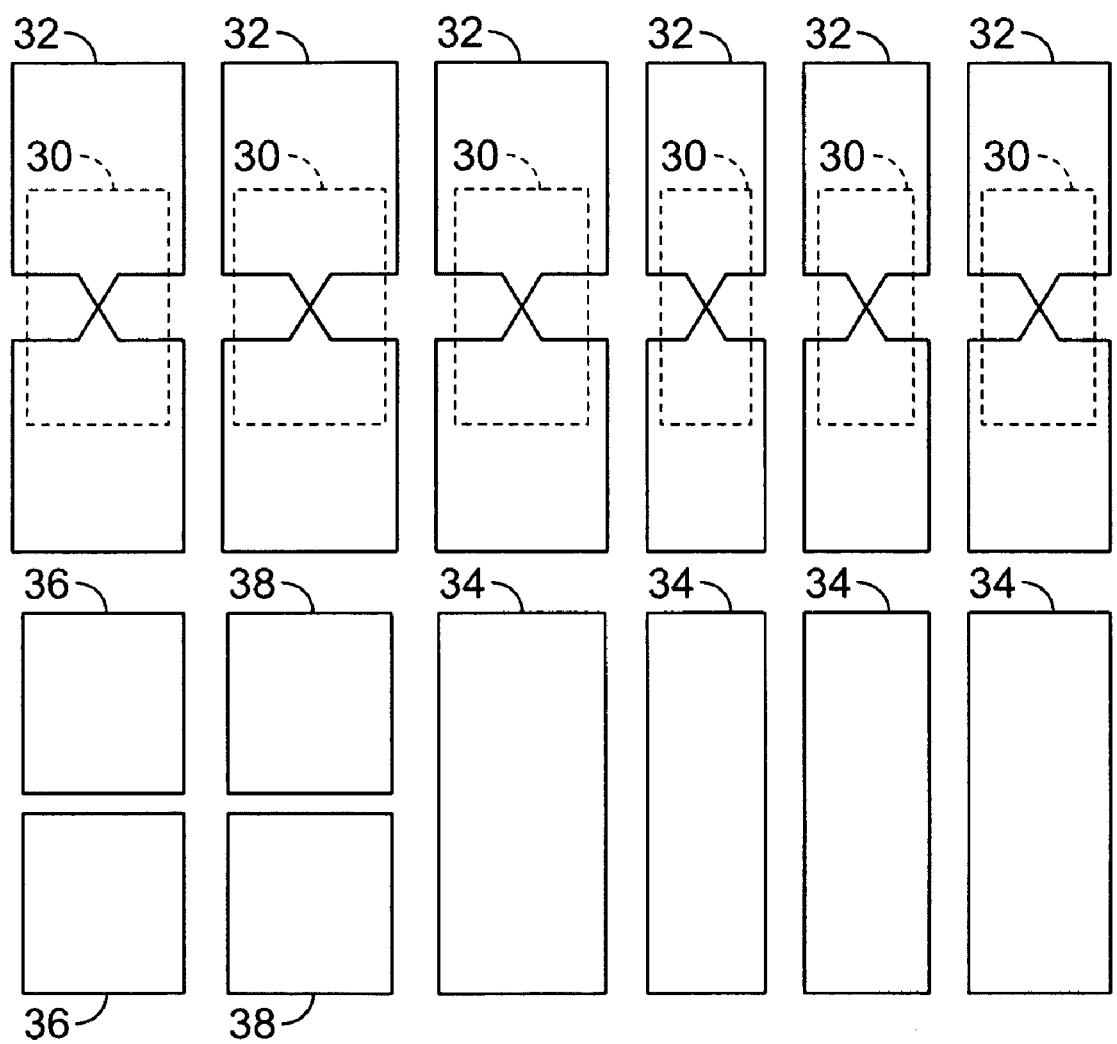
FIG. 5 is a schematic representation of exemplary coil elements for the coil of FIG. 1.

Referring to FIG. 5, an exemplary configuration of coil elements for the array coil 10 includes six pairs of loop coils 30 and butterfly coils 32 along the B1 field direction for the posterior array 12. The butterfly-loop combination constitute a quadrature pair that allows the use of quadrature detection. The anterior torso coil 14 includes the four loop coils 34. The anterior head-neck-upper-chest array 16 is formed from two loop coils 36 in the head portion 18 and two loop coils 38 in the neck-upper-chest portion 20.

The twenty elements of FIG. 5 can generate images with limit of acceleration factors of 2 along the transverse directions (X, Y) and up to an acceleration factor of 6 along the axial direction.

It is of course possible to employ other coil configurations depending on the desired SNR, acceleration factor and such issues as the number of receiver channels.

There are three primary objectives for choosing a particular SENSE geometry for a radio frequency (RF) resonator. The first objective is to maintain and/or improve SNR over the maximum possible coverage or field of view (FOV) for the coil. The second objective is to generate the best possible RF field uniformity inside the targeted FOV. The third objective is to design an RF coil that is compatible with parallel acquisition techniques, like SENSE, SMASH and their derivatives, with the maximum acceleration factor possible across any preferred direction. The array coil 10 provides a coil with parallel imaging capabilities across any direction of the imaging plane.

The attachment of the neck-upper-chest portion 20 to the head portion 18 allows the portion 20 to exhibit an up and down rotational motion, as well as, an up and down translational motion. This allows the portion 20 to conform as close as possible to the chest and upper neck anatomy of any size human subject.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A MRI array coil configured for imaging a human, comprising:
   a posterior array;
   an anterior torso array detachably connectable to said posterior array; and
   an anterior head-neck-upper-chest array, said anterior head-neck-upper-chest array having an anterior head portion with a locking member, said anterior head portion being detachably mountable to said posterior array, wherein said anterior neck-upper-chest portion is hingingly attached to said anterior head portion at a hinging joint integrally formed with said anterior head portion as a single piece and wherein said locking member of said anterior head portion is configured to lock the hinging joint in a position.

2. An MRI array coil according to claim 1, wherein said posterior array comprises an array of quadrature coil pairs and said anterior arrays each include an array of loop coils.

3. An MRI array coil according to claim 1, wherein sad MRI array coil is operable in a parallel processing mode.

4. An MRI array coil according to claim 1, wherein said anterior torso array is flexibly conformable to a human torso.

5. An MRI array coil according to claim 4, further comprising flexible straps, which secure said anterior torso array to said posterior array.

6. An MRI array coil according to claim 1, further comprising complementary interlocking structures on each of said head-neck-upper-chest array and said posterior array.

7. An MRI array coil according to claim 1, wherein said neck-upper-chest portion is hingingly attached to a nose portion of said head portion.

8. An MRI array coil according to claim 1, wherein said neck-upper-chest portion is pivotable in an axial direction relative to said head portion.

9. An MRI array coil according to claim 1, wherein said neck-upper-chest portion comprises sides formed of a flexible material.

10. An MRI array coil according to claim 2, wherein the array of quadrature coil pairs comprise six pairs of loop coils and butterfly coils.

11. An MRI array coil according to claim 1, wherein said anterior torso coil comprises four loop coils.

12. An MRI array coil according to claim 1, wherein said neck-upper-chest portion and said head portion each comprise two loop coils.

13. An MRI array coil configured for imaging a human, comprising:
    a posterior array;
    an anterior torso array separate from and removably connectable to said posterior array; and
    an anterior head-neck-upper-chest array, said head-neck-upper-chest array having:
       a head portion with a locking member, which is detachably mountable to said posterior array, wherein said head portion is configured to encompass an upper portion of a head of a patient extending from a nose of the patient; and
       a neck-upper-chest portion pivotally connected to said head portion and configured to encompass a lower portion of said head of the patient extending from said nose of the patient, said neck-upper-chest portion having a generally T-shaped configuration; and
    wherein said locking member of said head portion is configured to lock said pivotally connected neck-upper-chest portion in a position.

14. An MRI array coil according to claim 13, wherein said neck-upper-chest portion is pivotable in an axial direction relative to said head portion.

15. An MRI array coil according to claim 13, further comprising a hinging joint providing the pivotable connection and configured to be locked in a plurality of positions.

16. An array coil according to claim 13, wherein the pivotable connection is configured in order to provide rotational and translational motion.

17. An MRI array coil according to claim 13, further comprising flexible straps configured to connect said anterior torso array to said posterior array.

18. A method of providing an MRI array coil in order to image a human, said method comprising:
    configuring an anterior torso array to be removably connectable to a posterior array; and
    configuring an anterior head-neck-upper-chest array to include:
       an anterior head portion with a locking member, said head portion being removably connectable to said posterior array; and
       an anterior neck-upper-chest portion hingingly attached to say anterior head portion at a hinging joint integrally formed with said anterior head portion as a single piece, wherein said locking member of said anterior head portion is configured to lock the hinging joint in a position.

19. An MRI array coil according to claim 18, further comprising configuring the neck-upper-chest portion in order to provide rotational and translational motion.

20. An MRI array coil according to claim 18, further comprising providing a hinging joint at a nose area of said head-neck-upper-chest array in order to provide pivotal movement.

* * * * *